(12) United States Patent
Cheng et al.

(10) Patent No.: US 11,807,798 B2
(45) Date of Patent: Nov. 7, 2023

(54) CU-DOPED SB-TE SYSTEM PHASE CHANGE MATERIAL, PHASE CHANGE MEMORY AND PREPARATION METHOD THEREOF

(71) Applicant: HUAZHONG UNIVERSITY OF SCIENCE AND TECHNOLOGY, Hubei (CN)

(72) Inventors: Xiaomin Cheng, Hubei (CN); Yuntao Zeng, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/928,932

(22) PCT Filed: Dec. 22, 2021

(86) PCT No.: PCT/CN2021/140394
§ 371 (c)(1),
(2) Date: Dec. 1, 2022

(87) PCT Pub. No.: WO2023/108749
PCT Pub. Date: Jun. 22, 2023

(65) Prior Publication Data
US 2023/0287253 A1    Sep. 14, 2023

(30) Foreign Application Priority Data
Dec. 15, 2021    (CN) .......................... 202111535353.8

(51) Int. Cl.
*C09K 5/06*    (2006.01)
*C23C 14/35*    (2006.01)
(Continued)

(52) U.S. Cl.
CPC .......... *C09K 5/063* (2013.01); *C23C 14/0623* (2013.01); *C23C 14/352* (2013.01); *H10B 63/10* (2023.02); *H10N 70/8828* (2023.02)

(58) Field of Classification Search
CPC ... C09K 5/063; C23C 14/0623; C23C 14/352; H10B 63/10; H10N 70/8828
See application file for complete search history.

(56) References Cited

U.S. PATENT DOCUMENTS

| | | | | |
|---|---|---|---|---|
| 2007/0001160 | A1 | 1/2007 | Cheong | |
| 2013/0260527 | A1* | 10/2013 | Carter | H10N 70/028 257/E21.003 |
| 2015/0144865 | A1* | 5/2015 | Soeya | H10N 70/231 257/5 |

FOREIGN PATENT DOCUMENTS

| | | |
|---|---|---|
| CN | 101488558 | 7/2009 |
| CN | 102361063 | 2/2012 |

(Continued)

OTHER PUBLICATIONS

"International Search Report (Form PCT/ISA/210) of PCT/CN2021/140394," dated Sep. 15, 2022, pp. 1-4.
(Continued)

*Primary Examiner* — Andrew J. Oyer
(74) *Attorney, Agent, or Firm* — JCIPRNET

(57) ABSTRACT

A Cu-doped $Sb_2Te_3$ system phase change material, a phase change memory, and a preparation method thereof belonging to the technical field of micro-nano electronics are provided. A Sb—Te system phase change material is doped with Cu element to form $Cu_3Te_2$ bonds with both tetrahedral and octahedral structures in the case of local enrichment of Cu. The strongly bonded tetrahedral structure improves the amorphous stability and data retention capability of the Sb—Te system phase change material, and the octahedral structure of the crystal configuration improves the crystal-
(Continued)

lization speed of the Sb—Te system phase change material. A phase change memory including the phase change material and a preparation method of the phase change material are also provided. Through the phase change material provided by the invention, both the speed and amorphous stability of the device are improved, and the comprehensive performance of the phase change memory is also enhanced.

10 Claims, 4 Drawing Sheets

(51) Int. Cl.
*H10N 70/00* (2023.01)
*H10B 63/10* (2023.01)
*C23C 14/06* (2006.01)

(56) References Cited

FOREIGN PATENT DOCUMENTS

| | | |
|---|---|---|
| CN | 105393375 | 12/2018 |
| CN | 110729400 | 1/2020 |

OTHER PUBLICATIONS

"Written Opinion of the International Searching Authority (Form PCT/ISA/237) of PCT/CN2021/140394," dated Sep. 15, 2022, pp. 1-3.

* cited by examiner (a)

(b)

CU-DOPED SB-TE SYSTEM PHASE CHANGE MATERIAL, PHASE CHANGE MEMORY AND PREPARATION METHOD THEREOF

CROSS-REFERENCE TO RELATED APPLICATION

This application is a 371 application of International PCT application serial no. PCT/CN2021/140394 filed on Dec. 22, 2021, which claims the priority benefit of China application no. 202111535353.8, filed on Dec. 15, 2021. The entirety of each of the above mentioned patent applications is hereby incorporated by reference herein and made a part of this specification.

TECHNICAL FIELD

The disclosure belongs to the technical field of micro-nano electronics, and more particularly, relates to a Cu-doped Sb—Te system phase change material, a phase change memory, and a preparation method thereof.

DESCRIPTION OF RELATED ART

Nowadays, in the era of rapid development of electronic technology and information industry, people's demand for non-volatile memory increases along with the explosive growth of data. Featuring advantages such as high integration, fast response speed, long cycle life, and low power consumption, a phase change memory (PCM) is considered, by the Semiconductor Industry Association, as the memory most likely to replace flash memory and DRAM and become the mainstream memory in the future.

The basic principle of the phase change memory device unit is to use an electrical pulse signal to act on the device unit, so that the phase change material undergoes a reversible phase transition between an amorphous state and a polycrystalline state to achieve the storage of "0" and "1". An electric pulse with a narrow pulse width and high amplitude as a RESET operation are respectively applied and performed on the device unit. The crystalline phase change memory material melts, rapidly cools, and transforms into an amorphous disordered state, and a rapid resistance transition from a low-resistance state "0" to a high-resistance state "1" is achieved. On the contrary, an electric pulse with a wide pulse width and low amplitude as a SET operation are respectively applied and performed on the unit. The amorphous phase change memory material undergoes an annealing-like process to crystallize and return to a low resistance state, enabling "1" to be erased and written back to "0".

Phase change materials are mainly chalcogenide materials, and compounds composed of three elements, Ge, Sb, and Te, are the most common. The Sb—Te system is a phase change material that has received extensive attention in recent years. Since the Sb—Te system has a low crystallization temperature and a growth-dominated crystallization process with a fast crystallization rate, a phase change memory device based on the Sb—Te system features the characteristics of fast SET speed. However, poor amorphous stability is provided, and there is still room for improvement regarding the data retention stability of the device.

The optimization of the performance of the phase change material is the key to improving the performance of the phase change memory, and the microstructure of the phase change material determines its macroscopic properties. At present, the performance of the Sb—Te system phase change material is optimized mainly through doping, especially the doping of the fourth main group element. The fourth main group element can form a tetrahedral structure with itself as the center after being doped into the Sb—Te system. In the amorphous state, the structure of strongly bonded tetrahedral clusters is considerably different from that of the Sb—Te crystal (octahedral), which hinders the spontaneous crystallization of phase change materials, so that the amorphous stability and data retention ability are improved. The above mentioned doping improves the amorphous stability of the Sb—Te phase change material but at the same time reduces its crystallization ability, and the crystallization speed of the system material is thereby decreased.

Therefore, a new method for modifying the Sb—Te material system is required to be developed, so as to enhance the amorphous stability of the Sb—Te system phase change material, increase its crystallization rate, achieve the compatibility between speed and stability, and allow the phase change memory material to be commercially applied.

SUMMARY

In view of the defects of the related art, the disclosure provides a Cu-doped Sb—Te system phase change material, a phase change memory, and a preparation method. The Sb—Te system phase change material is doped with Cu element to form a cluster with both tetrahedral and octahedral structures, so that the amorphous stability of the Sb—Te system phase change material is enhanced, its crystallization speed is improved, compatibility between erasing and writing speed and amorphous stability is achieved, and the problem of incompatibility between the SET speed and amorphous stability of the Sb—Te system phase change memory in the related art is solved.

To achieve the above, the disclosure provides Cu-doped Sb—Te system phase change material. Cu is doped atomically in a Sb—Te system material unevenly to form a local Cu-rich region, a $Cu_3Te_2$ bond are formed in the local Cu-rich region, and the $Cu_3Te_2$ bond refers to the bonding of Cu atoms and Te atoms to form a cluster having tetrahedral and octahedral lattice arrangements.

Further, the chemical formula and composition respectively are: $Cu_x(Sb—Te)_{1-x}$, where x represents the atomic percentage of the Cu element, and 5%<x<40%.

Further, the Sb—Te system material includes one or more of SbTe, $Sb_2Te$, $Sb_4Te$, and $Sb_2Te_3$.

Further, the Sb—Te system material is $Sb_2Te_3$, and the atomic percentage of the Cu element in the entire Cu-doped $Sb_2Te_3$ phase change material is 20%.

Further, in the Cu-doped $Sb_2Te_3$ phase change material, in an amorphous state, Cu atoms combine with Te atoms to form $Cu_3Te_2$ having both tetrahedral and octahedral structures.

Further, the Cu-doped $Sb_2Te_3$ phase change material is in the form of a thin film, and the thickness of the thin film is 5 nm to 300 nm.

Further, in $Cu_3Te_2$ bonding, the bond angles formed by Cu atoms and Te atoms are 90° and 109°.

According to the second aspect of the disclosure, the disclosure further provides a phase change memory including the Cu-doped Sb—Te system phase change material. The phase change memory includes a bottom electrode, an isolation layer, a phase change layer, and a top electrode stacked in sequence.

Further, performing a magnetron sputtering, a chemical vapor deposition, an atomic layer deposition, an electroplating, or an electron beam evaporation to prepare the Cu-doped Sb—Te system phase change material. When the material is obtained by magnetron sputtering, the magnetron sputtering is Sb target, Te target, and Cu target co-sputtering, $Sb_2Te_3$ target and Cu target co-sputtering, or Cu-doped $Sb_2Te_3$ alloy target sputtering.

Further, when preparing the Cu—$Sb_2Te_3$ phase change layer, performing the $Sb_2Te_3$ target and the Cu target are co-sputtered to obtain the Cu—$Sb_2Te_3$ phase change layer, and the doping amount of Cu element is controlled by controlling the power of elemental Cu sputtering to control the numbers of tetrahedral structures and octahedral structures in the amorphous state of the phase change material to regulate the crystallization temperature and crystallization speed of the Cu—$Sb_2Te_3$ phase change memory material.

To sum up, the above technical solutions provided by the disclosure have the following beneficial effects compared with the related art.

In the disclosure, different from the conventional doping that improves single performance, after the Cu element is doped into the Sb—Te system phase change material, $Cu_3Te_2$ having both tetrahedral and octahedral structures is formed in the case of local enrichment of Cu. The strongly bonded tetrahedral structure can improve the amorphous stability and data retention capability of the Sb—Te phase change material, and the octahedral structure of the crystal configuration can improve the crystallization speed of the Sb—Te phase change material. In this way, the contradictory properties of amorphous stability and crystallization speed can be improved at the same time and compatibility of speed and stability is achieved, facilitating the commercial application of the phase change memory based on this material. Further, the method provided by the disclosure is simple and feasible, and is suitable for popularization and application in engineering practice.

Figure 3:
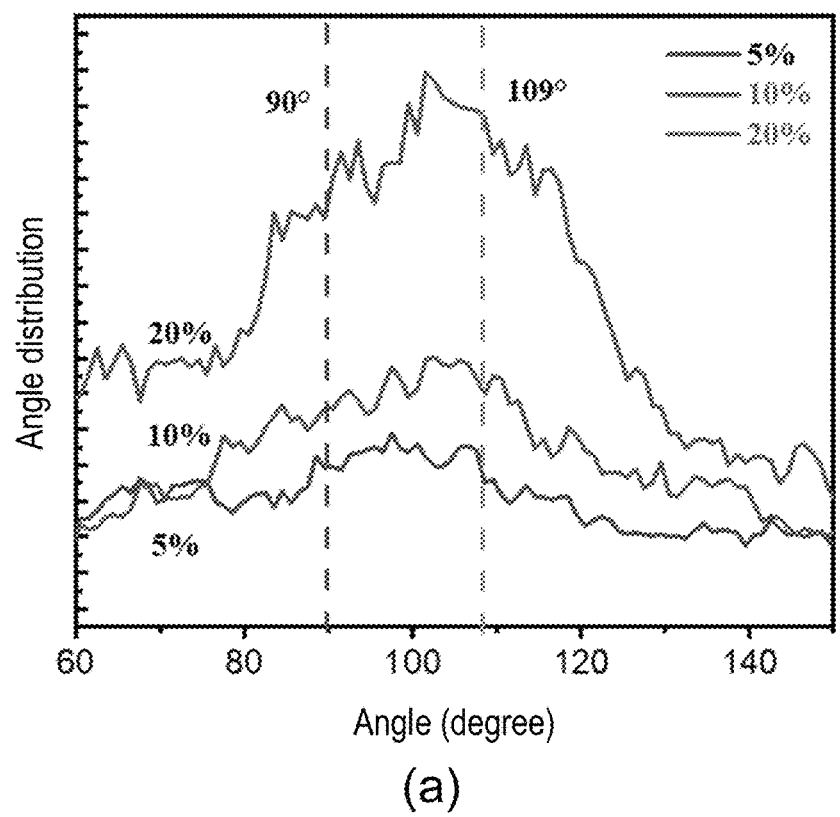
Figure 3:
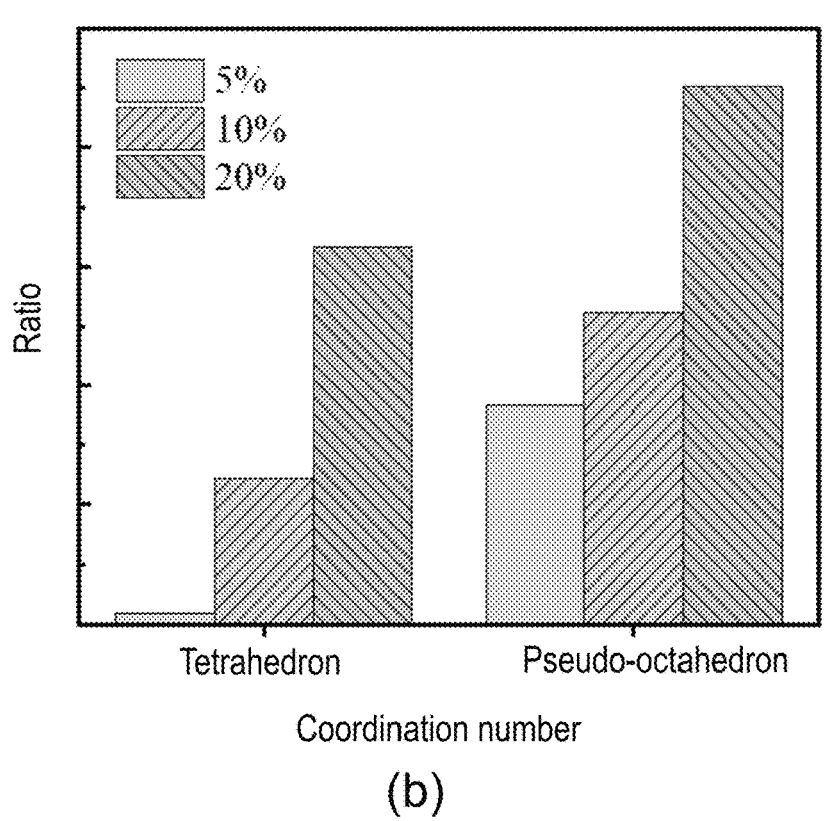

(a) of FIG. 3 is a curve chart illustrating the distribution of the bond angles of Cu atoms in an amorphous model of a Cu—$Sb_2Te_3$ phase change memory thin film material with Cu element doped at atomic concentrations of 5%, 10%, and 20% according to an embodiment of the disclosure.

(b) of FIG. 3 is a chart illustrating the statistical results of the numbers of tetrahedrons and pseudo-octahedrons in the amorphous model of the Cu—$Sb_2Te_3$ phase change memory thin film material with Cu element doped at atomic concentrations of 5%, 10%, and 20% according to an embodiment of the disclosure.

Figure 4:
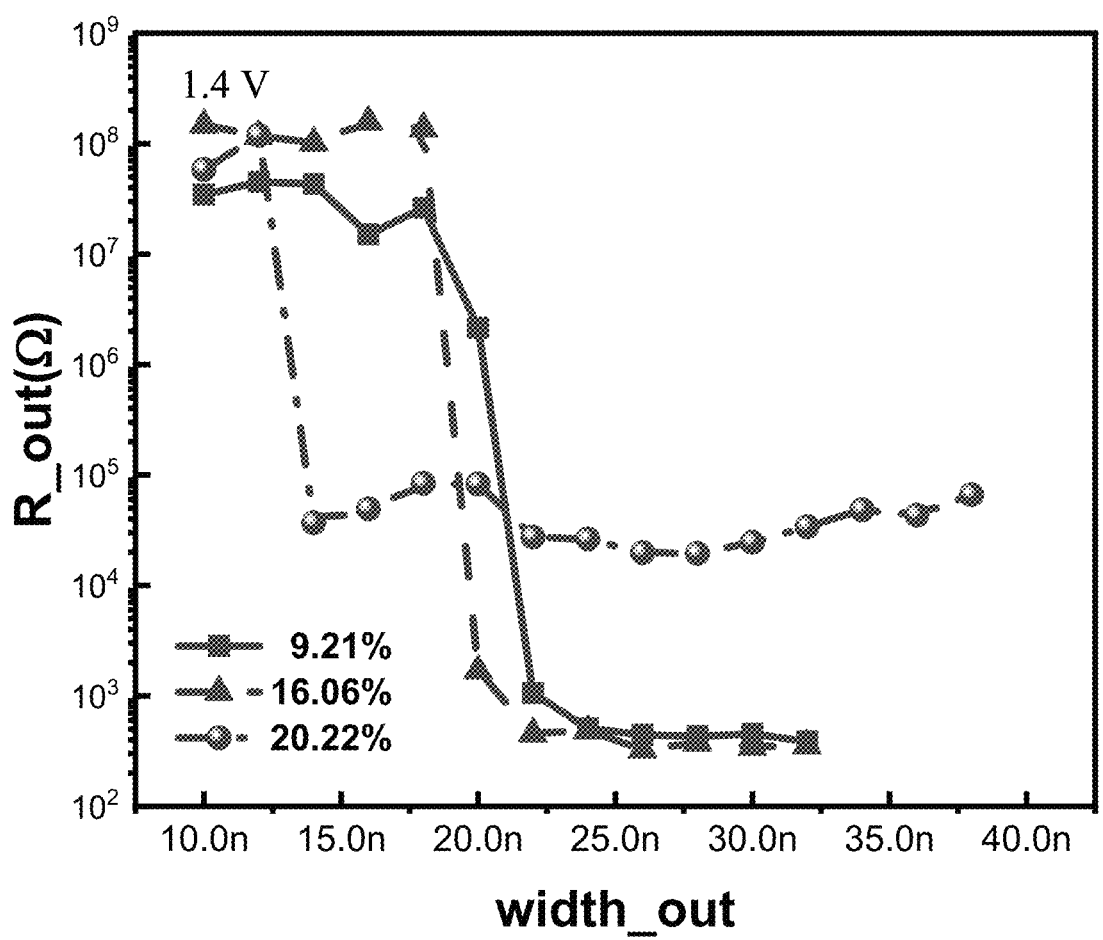

FIG. 4 is a test chart of the set speed performance of a Cu—$Sb_2Te_3$ phase change memory with different doping ratios according to an embodiment of the disclosure.

Figure 5:
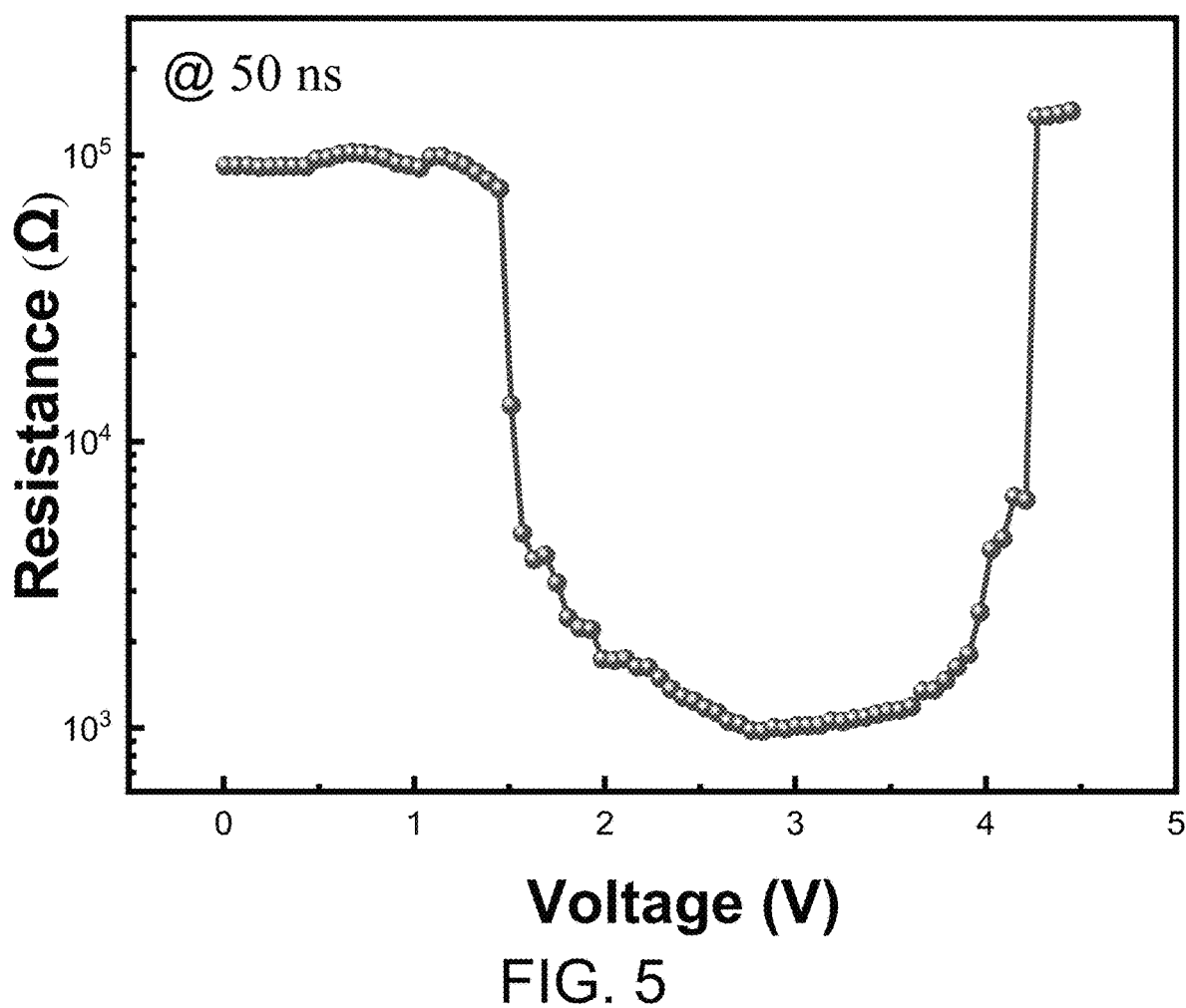

FIG. 5 is a test chart of the set speed performance of a pure $Sb_2Te_3$ phase change memory.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure.

Figure 1:
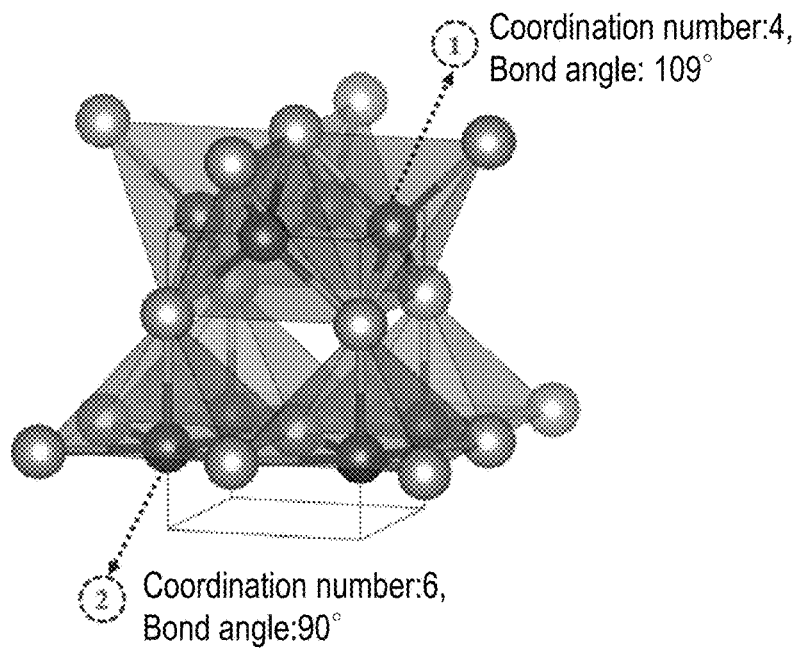
FIG. 1 is a schematic diagram of $Cu_3Te_2$ having both tetrahedral and octahedral structures after doping with Cu according to the disclosure.

The disclosure provides and designs a fast and highly stable phase change material of Cu-doped Sb—Te system. After the Cu element is doped into the Sb—Te phase change material, $Cu_3Te_2$ with both tetrahedral and octahedral structures is formed in the case of local enrichment of Cu, as shown in FIG. 1. To be specific, the strongly bonded tetrahedral structure can improve the amorphous stability and data retention capability of the Sb—Te phase change material, and the octahedral structure of the crystal configuration can improve the crystallization speed of the Sb—Te phase change material. In this way, the contradictory properties of amorphous stability and crystallization speed can be improved at the same time, facilitating the commercial application of the phase change memory based on this material.

To be more specific, in the disclosure, a fast and highly stable phase change material is obtained by introducing Cu element into a $Sb_2Te_3$ phase change memory material, and the general formula of its chemical composition is $Cu_x(Sb_2Te_3)_{1-x}$, wherein x represents the atomic percentage of Cu element, the preferred value range of x is 5%<x<40%, more preferably 10%<x<30%, and further preferably x=20%. By adjusting the corresponding power during preparation, the value of x can be regulated. Preferably, the thickness of a Cu-doped $Sb_2Te_3$ fast and highly stable phase change memory thin film material is 5 nm to 300 nm.

In the disclosure, the Cu-doped $Sb_2Te_3$ fast and highly stable phase change memory thin film material measured by the real-time change curve of in-situ thin film resistance with annealing temperature has a thickness of 100 nm.

In an embodiment of the disclosure, a phase change memory unit sequentially includes a bottom electrode, an isolation layer, a phase change layer, and a top electrode. The material of the phase change layer is the Cu-doped $Sb_2Te_3$ fast and highly stable phase change memory thin film material provided by the disclosure, which is filled in small holes with a diameter of 250 nm and a depth of 100 nm. The material of the bottom electrode is Pt. The material of the isolation layer is $SiO_2$. The material of the top electrode is Pt.

The disclosure provides a method for preparing a Cu-doped Sb—Te fast and highly stable phase change memory thin film material for a phase change memory. The method includes magnetron sputtering, chemical vapor deposition, atomic layer deposition, electroplating, electron beam evaporation, etc. Among these methods, the magnetron sputtering method is the most flexible in preparation because a Sb target, a Te target, and a Cu target can be used for co-sputtering, a Sb—Te target and a Cu target can be used for co-sputtering, or a Cu—Sb—Te alloy target can be used for sputtering. All of these methods can be used to prepare the Cu-doped Sb—Te fast and highly stable phase change memory thin film material and device provided by the disclosure according to the proportion of the general chemical formulas.

The Cu-doped Sb—Te fast and highly stable phase change memory thin film material and device provided by the disclosure have mature preparation processes and are easy to be compatible with the existing microelectronic process technology. The unique coexistence structure of tetrahedron and octahedron can improve both the stability and operation speed of the material and device. Compared with the pure $Sb_2Te_3$ phase change memory device, the speed of the Cu-doped $Sb_2Te_3$ fast and highly stable phase change memory device provided by the disclosure is increased by about 4 times, which is 14 ns, the crystallization temperature is increased to above 400° C., and the amorphous stability is greatly improved.

The phase change material, the phase change memory, and the preparation method provided by the disclosure are further described in detail below with reference to specific embodiments.

Example 1

In this embodiment, the chemical formula of the prepared Cu-doped $Sb_2Te_3$ fast and highly stable phase change memory thin film material for the phase change memory device is $Cu_x(ST)_{1-x}$, where ST represents $Sb_2Te_3$, and the value of x is adjusted by the Cu target sputtering power.

The Cu—$Sb_2Te_3$ phase change memory thin film material was prepared by magnetron sputtering. During preparation, high-purity argon gas was introduced as the sputtering gas, and the sputtering gas pressure was 0.5 Pa. The $Sb_2Te_3$ target was powered by an AC power supply with a power supply of 60 W. The specific preparation process includes the following steps.

1. A $SiO_2$/Si (100) substrate with a size of 1 cm×1 cm was selected, the front and back surfaces were cleaned, and dust particles and organic and inorganic impurities were removed.
  a) The $SiO_2$/Si (100) substrate was placed in an acetone solution, ultrasonically vibrated with a power of 40 W for 10 minutes, and rinsed with deionized water.
  b) The acetone-treated substrate was vibrated in an ethanol solution with ultrasonic waves with a power of 40 W for 10 minutes and rinsed with deionized water, and the front and back surfaces of the substrate were dried with high-purity $N_2$ gas to obtain a substrate to be sputtered.
2. The Cu—$Sb_2Te_3$ phase change memory thin film material was prepared by AC power sputtering.
  a. The $Sb_2Te_3$ alloy target was placed, its purity reached 99.99% (atomic percentage), and its background vacuum was evacuated to $10^{-5}$ Pa.
  b. High-purity Ar gas was used as the sputtering gas, the sputtering gas pressure was adjusted to 0.5 Pa, and the distance between the target and the substrate was 120 mm.
  c. The power of the $Sb_2Te_3$ target was set to 60 W, and the Cu—$Sb_2Te_3$ phase change memory thin film materials with Cu element doping concentrations of 12.15%, 19.03%, 20.39%, and 35.28% were prepared by adjusting the sputtering power of the Cu target.
  d. The target was pre-sputtered for 10 minutes to clean the surface of the target.
  e. After the pre-sputtering was completed, the baffle was opened, and according to the predetermined sputtering time, different thicknesses of Cu—$Sb_2Te_3$ phase change memory thin film materials were sputtered. When the sputtering time was 7 min, the thickness of the prepared thin film was approximately 100 nm, which was used to measure the real-time change curve of in-situ thin film reflectance with annealing temperature.

Comparative Example 1

The $Sb_2Te_3$ phase change memory thin film material was prepared by magnetron sputtering. During preparation, high-purity argon gas was introduced as the sputtering gas, and the sputtering gas pressure was 0.5 Pa. The $Sb_2Te_3$ target was powered by an AC power supply with a power supply of 60 W. The specific preparation process includes the following steps.

1. A $SiO_2$/Si (100) substrate with a size of 1 cm×1 cm was selected, the front and back surfaces were cleaned, and dust particles and organic and inorganic impurities were removed.
  a) The $SiO_2$/Si (100) substrate was placed in an acetone solution, ultrasonically vibrated with a power of 40 W for 10 minutes, and rinsed with deionized water.
  b) The acetone-treated substrate was vibrated in an ethanol solution with ultrasonic waves with a power of 40 W for 10 minutes and rinsed with deionized water, and the front and back surfaces of the substrate were dried with high-purity $N_2$ gas to obtain a substrate to be sputtered.
2. The $Sb_2Te_3$ phase change memory thin film material was prepared by AC power sputtering.
  a. The $Sb_2Te_3$ alloy target was placed, its purity reached 99.99% (atomic percentage), and its background vacuum was evacuated to $10^{-5}$ Pa.
  b. High-purity Ar gas was used as the sputtering gas, the sputtering gas pressure was adjusted to 0.5 Pa, and the distance between the target and the substrate was 120 mm.
  c. The $Sb_2Te_3$ target power was set to 60 W.
  d. The target was pre-sputtered for 10 minutes to clean the surface of the target.
  e. After the pre-sputtering was completed, the baffle was opened, and according to the predetermined sputtering time, different thicknesses of $Sb_2Te_3$ phase change memory thin film materials were sputtered. When the sputtering time was 7 min, the thickness of the prepared thin film was approximately 100 nm, which was used to measure the real-time change curve of in-situ thin film reflectance with annealing temperature.

Figure 2:
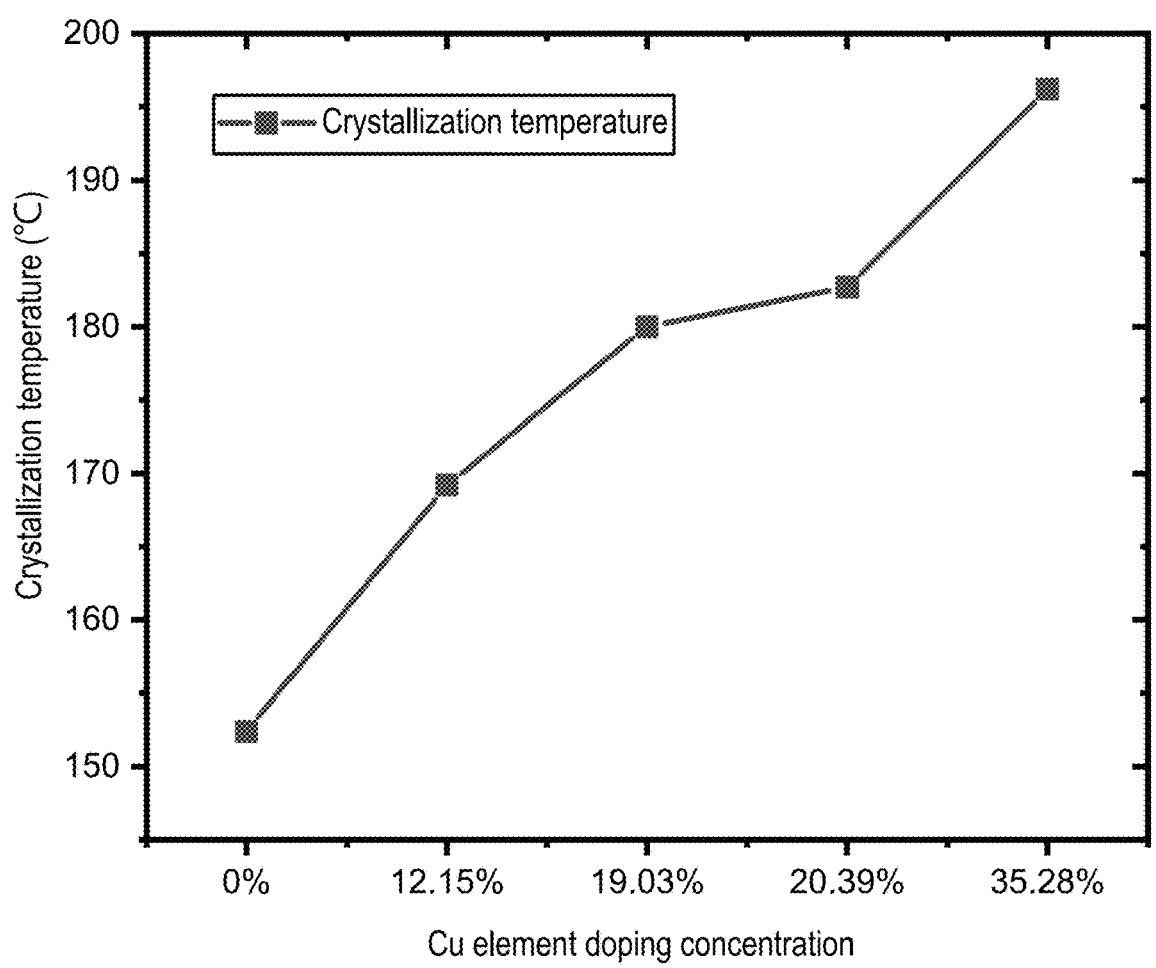
FIG. 2 is a schematic chart illustrating the variation of the crystallization temperature of a Cu—$Sb_2Te_3$ phase change memory material thin film with the doping concentration according to an embodiment of the disclosure. The crystallization temperature is determined by the real-time change curve of the in-situ thin film resistance with the annealing temperature, where the heating rate is 12° C./min.

A series of Cu—$Sb_2Te_3$ and $Sb_2Te_3$ phase change memory thin film materials in Example 1 and Comparative Example 1 above were tested. FIG. 2 is a schematic chart illustrating the variation of the crystallization temperature of Cu—$Sb_2Te_3$ and $Sb_2Te_3$ phase change memory material thin films with the doping concentration according to an embodiment of the disclosure. The crystallization temperature is determined by the real-time change curve of the in-situ thin film resistance with the annealing temperature, where the heating rate is 12° C./min. As can be seen in FIG. 2, with the increase of the doping concentration of Cu element, the crystallization temperature of the $Cu_x(ST)_{1-x}$ phase change memory material thin film gradually increases, and the amorphous stability is significantly improved.

Example 2

In this embodiment, the $Sb_2Te_3$ phase change memory thin film materials with Cu doping concentrations of 5%, 10%, and 20% were modeled by Materials Studio software. The randomization, melting, and quenching processes of the three models were simulated by first-principles, and the amorphous models of CuST phase change memory thin film materials with Cu concentration of 5%, 10%, and 20% were obtained. The bond angles of Cu atoms and the numbers of tetrahedrons and pseudo-octahedrons in each model were calculated and counted. The results are shown in FIG. 3.

(a) of FIG. 3 is the calculating results of the bond angles of Cu atoms in different models. It can be found that the bond angles are between 109° for tetrahedron and 90° for octahedron, which is in line with the expectation of introducing Cu atoms into tetrahedron and octahedron. (b) of FIG. 3 is a rough statistical result of the numbers of tetrahedrons and pseudo-octahedrons formed by Cu atoms in different models. Taking the coordination number of Cu atom as the corresponding index, the tetrahedral structure has a coordination number of 4, and the pseudo-octahedral structure has coordination numbers of 3, 5, and 6. It can be seen that as the doping concentration of Cu element increases, the numbers of tetrahedral structures and pseudo-octahedral structures in the material system increase, which is beneficial to improve the amorphous stability and crystallization speed of the material.

Example 3

In this embodiment, the Cu-doped $Sb_2Te_3$ fast and highly stable phase change memory thin film material was used as the phase change layer material to prepare the memory device. Herein, the Cu-doped $Sb_2Te_3$ fast and highly stable phase change memory thin film material layer was prepared by magnetron sputtering. During preparation, high-purity argon gas was introduced as the sputtering gas, and the sputtering gas pressure was 0.5 Pa. The $Sb_2Te_3$ target was powered by an AC power supply with a power supply of 60 W. The Cu target was powered by a DC power supply, and the power was 5 W, 10 W, and 20 W in turn. The specific preparation process includes the following steps.
1. A $SiO_2$/Si (100) substrate with a size of 1 cm×1 cm was selected, the front and back surfaces were cleaned, and dust particles and organic and inorganic impurities were removed.
   a) The $SiO_2$/Si (100) substrate was placed in an acetone solution, ultrasonically vibrated with a power of 40 W for 10 minutes, and rinsed with deionized water.
   b) The acetone-treated substrate was vibrated in an ethanol solution with ultrasonic waves with a power of 40 W for 10 minutes and rinsed with deionized water, and the front and back surfaces of the substrate were dried with high-purity $N_2$ gas to obtain a substrate to be sputtered.
2. The 100 nm of Pt lower electrode was prepared by DC power sputtering.
3. A 100 nm of $SiO_2$ insulating layer was deposited on the Pt lower electrode in step 2 by chemical vapor deposition.
4. Through the electron beam lithography etching process and the like, a through hole with a depth of 100 nm and a diameter of 250 nm was formed in the $SiO_2$ insulating layer of step 3.
5. Through a photolithography process, a memory array was formed.
6. The through hole formed in step 4 was filled with the Cu—$Sb_2Te_3$ phase change memory thin film material by using AC power sputtering.
   a. The $Sb_2Te_3$ alloy target was placed, its purity reached 99.99% (atomic percentage), and its background vacuum was evacuated to $10^{-5}$ Pa.
   b. High-purity Ar gas was used as the sputtering gas, the sputtering gas pressure was adjusted to 0.5 Pa, and the distance between the target and the substrate was 120 mm.
   c. The power of the $Sb_2Te_3$ target was set to 60 W, and the Cu—$Sb_2Te_3$ phase change memory thin film materials with Cu element doping concentrations of 9.21%, 16.06%, and 20.22% were prepared by adjusting the sputtering power of the Cu target.
   d. The target was pre-sputtered for 10 minutes to clean the surface of the target.
   e. After the pre-sputtering was completed, the baffle was opened, and according to the predetermined sputtering time, different thicknesses of Cu—$Sb_2Te_3$ phase change memory thin film materials were sputtered. When the sputtering time was 7 min, the thickness of the prepared phase change layer was approximately 100 nm.
7. A 100 nm of Pt upper electrode was prepared by DC power sputtering, and a complete phase change memory device array of fast and highly stable Cu-doped $Sb_2Te_3$ phase change memory layer was obtained.

Comparative Example 3

In this comparative example, a pure $Sb_2Te_3$ memory device was prepared using a pure $Sb_2Te_3$ phase change memory thin film material as the phase change layer.
1. A $SiO_2$/Si (100) substrate with a size of 1 cm×1 cm was selected, the front and back surfaces were cleaned, and dust particles and organic and inorganic impurities were removed.
   a. The $SiO_2$/Si (100) substrate was placed in an acetone solution, ultrasonically vibrated with a power of 40 W for 10 minutes, and rinsed with deionized water.
   b. The acetone-treated substrate was vibrated in an ethanol solution with ultrasonic waves with a power of 40 W for 10 minutes and rinsed with deionized water, and the front and back surfaces of the substrate were dried with high-purity $N_2$ gas to obtain a substrate to be sputtered.
2. The 100 nm of Pt lower electrode was prepared by DC power sputtering.
3. A 100 nm of $SiO_2$ insulating layer was deposited on the Pt lower electrode in step 2 by chemical vapor deposition.
4. Through the electron beam lithography etching process and the like, a through hole with a depth of 100 nm and a diameter of 250 nm was formed in the $SiO_2$ insulating layer of step 3.
5. Through a photolithography process, a memory array was formed.
6. The through hole formed in step 4 was filled with the $Sb_2Te_3$ phase change memory thin film material by using AC power sputtering.
7. A 100 nm of Pt upper electrode was prepared by DC power sputtering, and a complete phase change memory device array based on the $Sb_2Te_3$ phase change layer was obtained.

The electrical characteristics of the $Sb_2Te_3$ fast and highly stable phase change memory device based on different Cu doping ratios in the above example 3 and the pure $Sb_2Te_3$ phase change memory device in the comparative example 3 were tested. The test results are shown in FIG. 4 and FIG. 5.

FIG. 4 is a test chart of the set speed performance of a Cu—$Sb_2Te_3$ phase change memory with different doping ratios according to an embodiment of the disclosure. From the figure, it can be seen that as the doping concentration of Cu element increases from 9.210% to 16.06% and 20.22%, the critical pulse width of the device under the fixed-amplitude 1.4V pulse operation is increased from 22 ns to 20 ns and 14 ns, that is, the set speed is accelerated.

FIG. 5 is a test chart of the set speed performance of a pure $Sb_2Te_3$ phase change memory. The set speed of the pure $Sb_2Te_3$ phase change memory is used as a comparative example, and the pure $Sb_2Te_3$ device of the comparative example can only achieve set operation at the fastest pulse width of 50 ns. It thus can be seen that the incorporation of octahedral structure through Cu element doping can accelerate the crystallization of the $Sb_2Te_3$ material system, thereby improving the set speed performance of the device.

In the disclosure, in $Cu_x(Sb_2Te_3)_{1-x}$, x represents the atomic percentage of Cu element, and the preferred range of x is 5%<x<40%, more preferably 10%<x<20%, and further preferably x=20%. By adjusting the corresponding power during preparation, the value of x can be regulated. In general, the greater the sputtering power of elemental Cu, the higher the x value. The thickness of the Cu-doped Sb—Te fast and highly stable phase change memory thin film material is 5 nm to 300 nm, and the thickness can be adjusted by controlling the sputtering time. The longer the sputtering time, the thickness increases.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A Cu-doped Sb—Te system phase change material, wherein Cu is doped atomically in a Sb—Te system material unevenly to form a local Cu-rich region, a $Cu_3Te_2$ bond is formed in the local Cu-rich region, and the $Cu_3Te_2$ bond refers to bonding of Cu atoms and Te atoms to form a substance having tetrahedral and octahedral lattice arrangements.

2. The Cu-doped Sb—Te system phase change material according to claim 1, wherein a chemical formula of the Cu-doped Sb—Te system phase change material is: $Cu_x(Sb—Te)_{1-x}$, where x represents an atomic percentage of Cu element, and 5%<x<40%.

3. The Cu-doped Sb—Te system phase change material according to claim 2, wherein the Sb—Te system material comprises one or more of SbTe, $Sb_2Te$, $Sb_4Te$, and $Sb_2Te_3$.

4. The Cu-doped Sb—Te system phase change material according to claim 3, wherein the Sb—Te system material is $Sb_2Te_3$, and the atomic percentage of the Cu element in the entire Cu-doped Sb—Te system phase change material is 20%.

5. The Cu-doped Sb—Te system phase change material according to claim 3, wherein in the Cu-doped Sb—Te system phase change material, in an amorphous state, the Cu atoms combine with the Te atoms to form $Cu_3Te_2$ having both tetrahedral and octahedral structures.

6. The Cu-doped Sb—Te system phase change material according to claim 4, wherein the Cu-doped Sb—Te system phase change material is in the form of a thin film, and a thickness of the thin film is 5 nm to 300 nm.

7. The Cu-doped Sb—Te system phase change material according to claim 6, wherein in the $Cu_3Te_2$ bond, bond angles formed by Cu atoms and Te atoms are 90° and 109°.

8. A phase change memory comprising the Cu-doped Sb—Te system phase change material according to claim 4, comprising a bottom electrode, an isolation layer, a phase change memory material thin film layer, and a top electrode stacked in sequence.

9. A method for preparing the Cu-doped Sb—Te system phase change material according to claim 1, comprising: performing a magnetron sputtering, a chemical vapor deposition, an atomic layer deposition, an electroplating, or an electron beam evaporation to prepare the Cu-doped Sb—Te system phase change material, and when the Cu-doped Sb—Te system phase change material is obtained by the magnetron sputtering, the magnetron sputtering is Sb target, Te target, and Cu target co-sputtering, $Sb_2Te_3$ target and Cu target co-sputtering, or Cu-doped $Sb_2Te_3$ alloy target sputtering.

10. The method for preparing the Cu-doped Sb—Te system phase change material according to claim 9, wherein when preparing a $Cu—Sb_2Te_3$ phase change memory material, performing the $Sb_2Te_3$ target and the Cu target are co-sputtered to obtain the $Cu—Sb_2Te_3$ phase change memory material, and a doping amount of Cu element is controlled by controlling a power of elemental Cu sputtering to control numbers of tetrahedral structures and octahedral structures in an amorphous state of the $Cu—Sb_2Te_3$ phase change memory material to regulate a crystallization temperature and a crystallization speed of the $Cu—Sb_2Te_3$ phase change memory material.

* * * * *